United States Patent [19]
Gupta et al.

[11] Patent Number: 4,978,932
[45] Date of Patent: Dec. 18, 1990

[54] MICROWAVE DIGITALLY CONTROLLED SOLID-STATE ATTENUATOR HAVING PARALLEL SWITCHED PATHS

[75] Inventors: Ramesh K. Gupta; Bernard D. Geller, both of Rockville, Md.

[73] Assignee: Communications Satellite Corporation, Clarksburg, Md.

[21] Appl. No.: 216,921

[22] Filed: Jul. 7, 1988

[51] Int. Cl.$^5$ .............................................. H01P 1/22
[52] U.S. Cl. ................................... 333/81 R; 333/81 A; 333/262; 307/567; 307/568; 307/550
[58] Field of Search .................. 333/81 R, 81 A, 103, 333/262; 307/540, 547, 548, 550, 567, 568, 572

[56] References Cited

U.S. PATENT DOCUMENTS

| | | | |
|---|---|---|---|
| 3,753,170 | 8/1973 | Holland | 333/81 A |
| 3,902,078 | 8/1975 | Peterson | 307/573 |
| 3,977,291 | 8/1976 | Southard | 84/1.13 |
| 4,121,183 | 10/1978 | Murphy | 333/81 R |
| 4,138,637 | 2/1979 | Weinert | 333/81 R X |
| 4,320,348 | 3/1982 | Suzuki et al. | 330/52 |
| 4,363,001 | 12/1982 | Suzuki et al. | 330/107 |
| 4,438,415 | 3/1984 | Hopfer | 333/81 A |
| 4,485,349 | 11/1984 | Siegel | 330/3 |
| 4,523,161 | 6/1985 | Miles | 333/81 R |
| 4,535,300 | 8/1985 | Streckmann | 330/279 |
| 4,733,203 | 3/1988 | Ayasli | 333/103 X |
| 4,787,686 | 11/1988 | Tajima et al. | 307/550 X |
| 4,837,530 | 6/1989 | Kondoh | 333/81 A |

FOREIGN PATENT DOCUMENTS

| | | | |
|---|---|---|---|
| 153315 | 9/1984 | Japan | 333/81 R |
| 918998 | 4/1982 | U.S.S.R. | 333/81 A |

OTHER PUBLICATIONS

"DC to 20 Ghz MMIC GaAs FET Matched Attenuator", *Microwave Journal;* Mar. 1986; p. 195; M/A-Com Product Feature.
A 0.05-to 14-GHZ MMIC 5-Bit Digital Attenuator, Gupta et al., IEEE Journal, 10/87, pp. 231-234.

*Primary Examiner*—Benny T. Lee
*Attorney, Agent, or Firm*—Sughrue, Mion, Zinn, Macpeak & Seas

[57] ABSTRACT

An attenuator element has a reference path and a relative attenuation path. The reference path is formed by a T-network of two FETs operated in the passive mode and a shunt path and the attenuation path is formed with a similar structure, with the FETs in the shunt path having a different channel width. Instead of a T-network, a Pi-network of transistors can be used. The respective gates of the FETs along the reference path are connected to a first control input corresponding to either zero volts or the pinch-off voltage and the respective gates of the transistors on the attenuation path are connected to a complementary control input having a voltage corresponding to the other of zero volts and the pinch-off voltage. Another type of attenuator element is formed with a reference path having a transmission line and an attenuation path formed by a resistive T-network, with the attenuation and reference paths being alternately selectable by two single pole, double throw switches. The switches can also be formed by FETs operated in the passive mode, and be controlled by a control signals corresponding to either zero volts or the pinch-off voltage. Using one type or mixing both types of attenuator elements, an attenuator device is formed. The attenuator may be used in any attenuator application, and is especially applicable to on-board transponder applications in a communications satellite, and phased array antenna and radar applications.

29 Claims, 4 Drawing Sheets

MICROWAVE DIGITALLY CONTROLLED SOLID-STATE ATTENUATOR HAVING PARALLEL SWITCHED PATHS

BACKGROUND OF THE INVENTION

The invention relates to an attenuator. More specifically, the invention relates to a variable step attenuator which uses devices, such as field effect transistors (FETs), operating in the passive mode to minimize control power depletion and broaden the useful range of band widths of signals which can be attenuated. The invention is especially useful in satellite transponders as well as phased array satellite antennas and phased array radar devices.

There are many applications for attenuators. These applications include not only communications satellites, but also other communications systems, measurement instrumentation, and electrical apparatus such as televisions and radios.

For example in a satellite, especially one used for communications, a frequency division and/or time division multiplex signal transmitted from the ground to a receiving antenna on the satellite is then transmitted to a particular coverage area, such as the continental United States. During transmission of the signal from the ground to the satellite, and from the satellite to the ground there are losses in the amplitude of the signal. Losses in amplitude can also occur while the signal is being processed by circuitry on-board the satellite. Therefore, the signal received by the satellite is amplified by a gain sufficient to ensure that the signal transmitted to the ground will be accurately detected. However, on a satellite, it is important to minimize power consumption. During the life of the satellite its power output for amplifying the signal may decrease. If the gain is set to the largest amount allocated for the gain the set amount of gain cannot be maintained over the life of the satellite because the power output will decrease during the satellite's life. To avoid variations in gain, i.e. to keep gain constant, the gain is intentionally attenuated during an initial period of the satellite's life. Over the satellite's life, the attenuation is decreased so that the gain can be maintained relatively constant. Variable attenuators can also be used in phased array radar systems to adjust the amplitude of radar beam elements, and phased array antennas on-board satellites to control beam shape.

The type of attenuators which have been used include PIN-diode and ferrite step attenuators as well as dual-gate FETs. However ferrite attenuators are very heavy and bulky. PIN-diode devices are operated in active mode, i.e.. they consume power and are relatively susceptible to degradation and failure with the passage of time. The dual-gate FET devices suffer from many of the same drawbacks as the PIN-diode devices. Moreover, dual-gate FETs introduce undesirable phase changes when the attenuation level is varied. In analog devices, a digital to analog converter must be used. There is thus additional power consumption in controlling the device and the quality of operation varies with temperature changes.

As previously noted, present attenuators generally use active devices with analog gate control which requires converters and depletes power.

SUMMARY OF THE INVENTION

An object of the present invention is to provide a lighter, more compact attenuator.

Another object of the invention is to provide an attenuator which is digitally controlled, has a minimum variance in phase when attenuation level is varied, and can be used with a very broad range of frequencies especially microwaves.

A further object of the invention is to provide an attenuator which can be formed as a solid-state monolithic structure preferably using Gallium Arsenide (GaAs). which structure can be formed by use of a photolithographic process.

The invention is an attenuator element and a variable step attenuator device formed by cascading multiple attenuator elements so as to form a reference path and various attenuation paths.

A first type of attenuator element according to the invention is formed with a reference path and an attenuation path. The reference path is formed by a T-network including two FETs operating in the passive mode and functioning as variable resistors, with the drain of one FET connected to the source of the other, and a shunt path to ground including another FET and a resistor. The attenuation path of each element is formed the same way. The FETs in the reference path receive control inputs at their gates which inputs are either zero volts or a pinch-off voltage. The FETs in the attenuation path receive control inputs at their gates which inputs are complementary (i.e. the other of zero volts and the pinch-off voltage) to those being received by the FETs in the reference path.

A second type of attenuator according to the invention is formed using single pole, double throw switches at the input and output ends of the attenuator element. The switches are formed with FETs which are operated in the passive mode. This attenuator element has a reference path formed by a transmission line and an attenuation path formed by a resistive T-network including a shunt resistor to ground.

A variable step attenuator device according to the invention is formed by connecting attenuator elements according to the invention in cascade. The device is formed by using all attenuator elements of the first type, all of the second type, or some of each type. A reference path for the entire device is enabled by pinching-off each of the transistors in each attenuation path of each element, and applying zero volts to the gates of each of the transistors in each reference path of each element. Various desired attenuation levels are obtained by applying zero volts to the transistors in the various desired attenuation elements, pinching off the transistors in the remaining attenuation paths and applying, for each attenuator element, control signals to the gates of the various transistors in the reference path which are complementary to the control signals applied to the transistors in the attenuation element.

Other types of attenuator elements can be formed using a Pi-network (with transistors or resistors). These attenuator elements can also be used in the attenuator device according to the invention.

The attenuator elements and device according to the invention can be formed using a GaAs substrate as a solid-state monolithic structure.

BRIEF DESCRIPTION OF THE DRAWINGS

The above and other objects, features and advantages of the invention will be evident to one of ordinary skill in the art upon reading the detailed description set forth below in conjunction with the accompanying drawings, in which.

DETAILED DESCRIPTION OF THE PREFERRED EMBODIMENTS

The present invention is a digital attenuator in the form of an attenuator element (a single-bit attenuator) or an attenuator device formed by multiple attenuator elements (a multiple-bit attenuator). The inventive attenuator is formed using circuit elements, including FETs operated in passive mode and thus has a broad bandwidth with minimum phase changes and minimum power dissipation. In addition, attenuation steps have been obtained by combining switching and resistive properties and by selecting a channel width of FET devices operated in passive mode.

Figure 1:
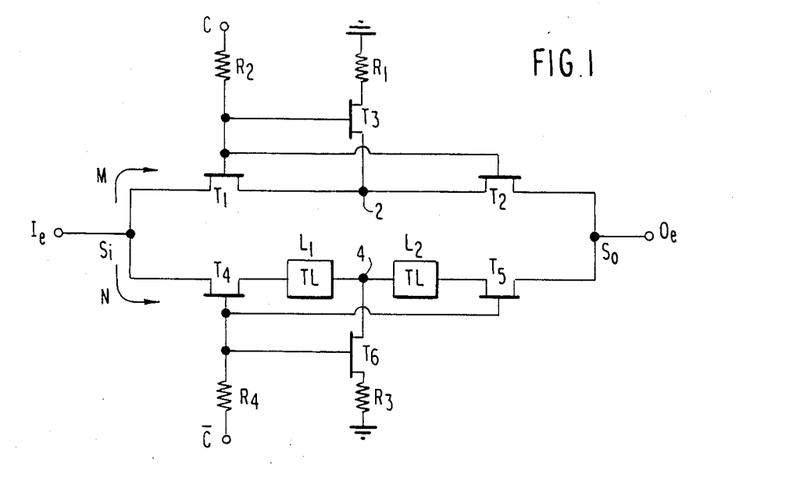
FIG. 1 is a circuit diagram of a first type of attenuator element according to the invention.

A first type of attenuator element according to the invention is shown in FIG. 1. The element has a reference path shown by arrow M and an attenuation path shown by arrow N. An input signal $S_i$ is delivered to an input terminal $I_e$. The input signal then travels along the reference path M or the attenuation path N, depending upon control signals being applied to the attenuator. If the input signal is following the reference path M, an output signal $S_o$ appearing at an output terminal $O_e$ will be unattenuated relative to when the input signal is following the attenuation path N.

The reference path M has two cascaded (series-connected) transistors $T_1$ and $T_2$, e.g. field effect transistors (FETs). with the source of one transistor connected to the drain of the other. For example, if the source of the FET $T_1$ is connected to the input terminal $I_e$, then its drain is connected to the source of the FET $T_2$ (at point 2) and the drain of the FET $T_2$ is connected to the output terminal $O_e$. At the connection point 2, a shunt path to ground is formed through another FET $T_3$ and a resistor $R_1$ so as to form a T-network with the transistors $T_1$ and $T_2$. Either the source or drain of the shunt FET $T_3$ can be connected to the point 2. The gates of the transistors $T_1$, $T_2$ and $T_3$ are all connected through a resistor $R_2$ to a control signal C. The control signal C is issued by a microprocessor (not shown in the drawings for purposes of clarity) or another device which is capable of issuing the control signal. Appropriate control devices are well-known to those of ordinary skill in the art.

The attenuation path N has substantially the same arrangement of elements as the reference path. There are two cascaded transistors (e.g. FETs) $T_4$ and $T_5$. and a shunt path to ground connected at a point 4 between the FETs $T_4$ and $T_5$. The shunt path includes another transistor (FET) $T_6$ and a resistor $R_3$. The gates of the transistors $T_4$, $T_5$ and $T_6$ are all connected by means of a resistor $R_4$ to a control signal $\overline{C}$.

In accordance with a feature of the invention channel width of the transistors is used as a design parameter for achieving a desired attenuation and characteristic impedance. For example, the transistors $T_1$ and $T_2$ in the reference path each have a channel width which is set relatively large to minimize any amplitude loss while the transistors $T_4$ and $T_5$ in the attenuation path each have a channel width which is set relatively small to provide a predetermined amplitude loss relative to that of reference path. HoweVer, due to the different channel widths, the capacitance of the transistors $T_1$ and $T_2$ will differ from that of the transistors $T_4$ and $T_5$. Accordingly there will be a relative phase difference in the attenuated output signal as compared with the unattenuated output signal. To equalize the phase of the reference and attenuation paths, inductors (e.g. transmission lines) $L_1$ and $L_2$ can be inserted between the transistors $T_4$ and $T_5$, with the connection point 4 between the inductors, as shown in FIG. 1. It should be noted that while the transmission lines $L_1$ and $L_2$ are shown in FIG. 1 between the transistors $T_3$ and $T_4$ and connected at the point 4, the transmission lines could be positioned elsewhere. For example, the transistor $T_4$ could have its drain connected to the source of the transistor $T_5$. and the transmission line $L_1$ could be connected to the source of the transistor $T_4$. The transmission line $L_4$ would then be connected to the drain of the transistor $T_5$.

All of the FETs $T_1$, $T_2$, $T_3$, $T_4$, $T_5$ and $T_6$ are operated in the passive mode and are normally fully conductive, but shut off when a pinch-off voltage is applied to their gates. The control inputs C and $\overline{C}$ are thus chosen to be complementary in that when one corresponds to zero volts, the other corresponds to the pinch-off voltage, and vice versa. Thus, only one digital bit is necessary to determine the value of the control input C and its complement $\overline{C}$. For example, when C is zero volts, $\overline{C}$ corresponds to the pinch-off voltage, the transistors $T_1$, $T_2$ and $T_3$ are fully conductive and the transistors $T_4$, $T_5$ and $T_6$ are off. Thus, the input signal $S_i$ will follow the reference path and be minimally attenuated. When C corresponds to the pinch-off voltage, $\overline{C}$ is zero volts the transistors $T_1$, $T_2$ and $T_3$ are off, and the transistors $T_4$, $T_5$ and $T_6$ are fully conductive. Thus, the input signal $S_i$ will follow the attenuation path.

As used herein operating a transistor in the passive mode refers to operation without applying a drain-to-source voltage gradient Rather, the transistor is used as a variable resistor for signal transmission, without drawing DC current and without amplification. In the device of FIG. 1, it should be noted that the FETs $T_1$ and $T_2$ in the reference path and the FETs $T_4$ and $T_5$ in the attenuation path function as switchable series resistive elements.

It should also be noted that both shunt paths to ground need not include the shunt FETs $T_3$ and $T_6$. However, the FETs $T_3$ and $T_6$ broaden the useful bandwidth by minimizing any leakage to ground (especially at high frequencies) due to the RC circuit created by the other transistors and the shunt resistors $R_1$ and $R_3$. The reduction in leakage is due to the drain-to-source capacitance of the FETs which exists when they are pinched-off. The resistors $R_2$ and $R_4$ are provided for purposes of isolating the control mechanism.

Figure 2:
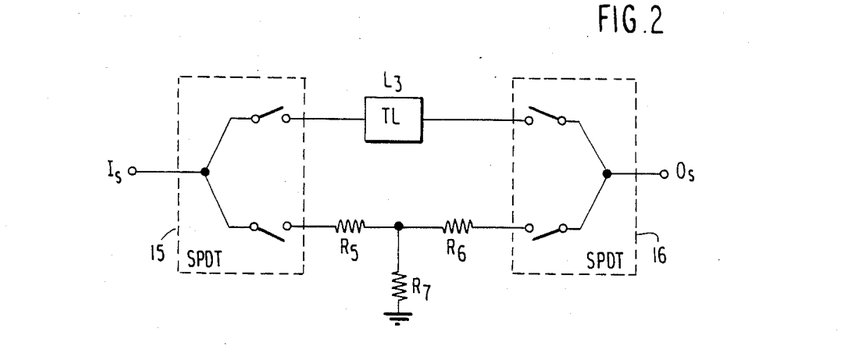
FIG. 2 is a circuit diagram of a second type of attenuator element according to the invention.
Figure 3:
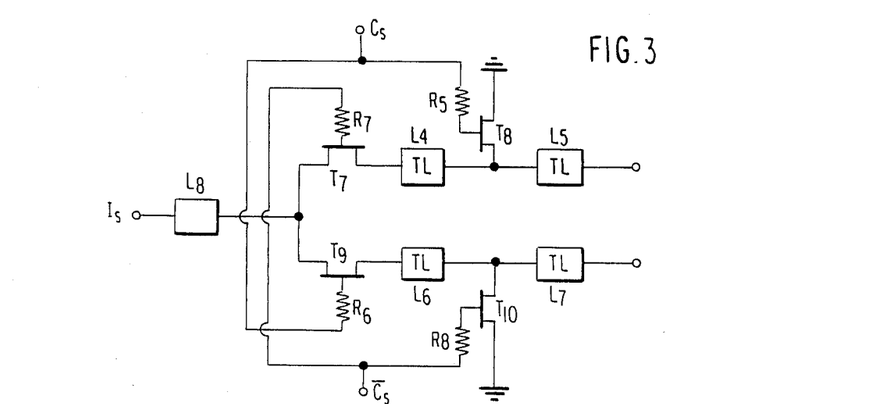
FIG. 3 is a detailed circuit diagram of a switch used in the attenuator element of FIG. 2.

A second type of attenuator element according to the invention is shown in FIG. 2. The input and output terminals are connected to either the reference path, which is formed by a transmission line $L_3$, or the attenuation path formed by a T-network having cascaded resistors $R_5$ and $R_6$ and a shunt resistor $R_7$. The length of the transmission line is selected so that it is equivalent to the length of the series resistors of the T-network in order to make any phase change occurring due to the reference path the same as any phase change occurring the attenuation path (i.e. to achieve a relative phase change of zero). Connection with the reference or attenuation path is performed by two switches: a first single pole, double throw (SPDT) switch 15 with its single pole connected to input terminal $I_s$, and a second SPDT switch 16 with its single pole connected to output terminal $O_s$. Both switches are constructed as shown in FIG. 3. One branch of the SPDT switch of FIG. 3 is formed by FET $T_7$ connected in series with two additional transmission lines $L_4$ and $L_5$ which are in a T-network with a shunt FET $T_8$ to ground. The other branch of the switch is formed the same way, using FETs $T_9$ and $T_{10}$, and transmission lines $L_6$ and $L_7$. The gates of the shunt transistor $T_8$ of one branch and the series connected transistor $T_9$ of the other branch are connected through resistors $R_5$ and $R_6$, respectively, to a control output $C_s$, and the gates of the transistor $T_7$ of the one branch and the shunt transistor $T_{10}$ of the other branch are connected to a complementary control signal $\overline{C}_s$ through resistors $R_7$ and $R_8$ respectively. The input of each SPDT switch has a transmission line $L_8$. The transistors and transmission lines are used and selected for equalizing the impedance of the reference and attenuation paths, and for matching impedance of the attenuator element with a desired impedance, such as a standard impedance of 50Ω. The transistor and transmission line combination also results in a switchable low-pass response in the ON-state. The SPDT switches, because no external capacitive elements are used in the design, have a broad band, as does the resistive T-network. All of the circuit elements are operated passively.

In FIG. 3, $I_s$ represents an input terminal.

Figure 4:
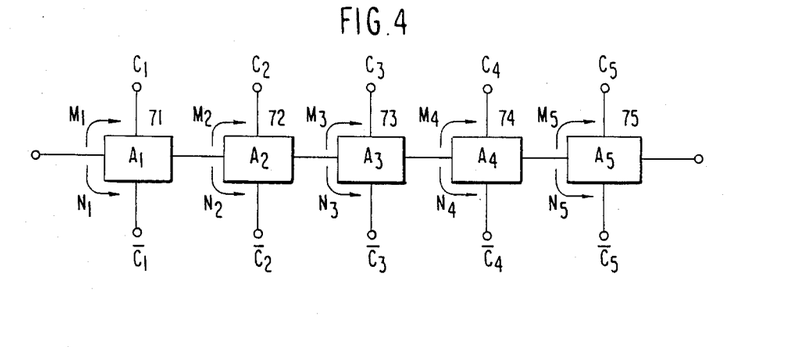
FIG. 4 is a diagram of an attenuator device, incorporating attenuator elements, according to the invention.

An attenuator device according to the invention is shown in FIG. 4, in which five attenuator elements 71, 72, 73, 74 and 75 are connected in series. The elements 71-75 have respective relative attenuation levels of $A_1$, $A_2$, $A_3$, $A_4$ and $A_5$. All of the attenuator elements 71-75 can be constructed as shown in FIG. 1 or FIGS. 2-3. It is also possible to form some elements as shown in FIG. 1 and others as shown in FIGS. 2-3.

The attenuator device has a total reference path formed by the reference paths $M_1$, $M_2$, $M_3$, $M_4$ and $M_5$ of each attenuator element, and a maximum relative attenuation path formed by each of the attenuation paths $N_1$, $N_2$, $N_3$, $N_4$ and $N_5$. The transistors along the total reference path receive respective control inputs $C_1$, $C_2$, $C_3$, $C_4$ and $C_5$, and the transistors along the maximum attenuation path receive complementary control inputs $\overline{C}_1$, $\overline{C}_2$, $\overline{C}_3$, $\overline{C}_4$ and $\overline{C}_5$, respectively. To follow the maximum attenuation path, the control inputs $C_1$ through $C_5$ are each set to the pinch-off voltage, and the complementary control inputs $\overline{C}_1$ through $\overline{C}_5$ are each set to zero. In contrast to follow the total reference path, the control inputs are set to zero and the complementary control inputs are set to the pinch-off voltage. To obtain paths with relative attenuation values varying between zero (total reference path) and $A_1+A_2+A_3+A_4+A_5$ (maximum attenuation path), the appropriate control inputs and complementary control inputs must be applied. For example, to obtain an attenuation amount of $A_2+A_4$, control inputs $C_1$, $C_3$, $C_5$ and complementary control inputs $\overline{C}_2$ and $\overline{C}_4$ are set to zero, and control inputs $C_2$ and $C_4$ and complementary control inputs $\overline{C}_1$, $\overline{C}_3$ and $\overline{C}_5$ are set to the pinch-off voltage.

In general, the attenuation values of each attenuation element can be selected based on the desired maximum attenuation and desired step attenuation $A_s$ (difference between each possible attenuation value). To minimize the number of attenuation elements for a given range of attenuation values, it is useful to form an attenuation element with the step attenuation $A_s$. The next attenuation element is formed using an attenuation of twice $A_s$, and the next element has a value four times $A_s$ (i.e. twice the previous value of $2A_s$), and so on, until the sum of the attenuation values selected in this manner equals or exceeds the desired maximum attenuation.

Accordingly an example of desirable attenuation values for $A_1$ through $A_5$ in FIG. 4 is: 0.5, 8, 2, 4 and 1 dB respectively. These values yield attenuation values between zero and 15.5 dB by increments of 0.5 dB. It should be noted that in such an attenuator device, it may be useful to form the 4 and 8 dB attenuator elements with the resistive T-networks, transmission lines and SPDT switches as shown in FIGS. 2-3 to satisfy fabrication considerations and the 0.5, 1 and 2 dB attenuator elements with the transistor T-networks of FIG. 1. Alternatively, each attenuation element could be formed as two attenuation elements, e.g. a 4 dB element could be formed using two 2 dB elements.

Another useful Variation of the attenuator device of FIG. 4 can be formed using only three attenuator elements with attenuation values of 2, 4 and 8 dB, respectively, so that an attenuation range from zero to 14 dB at intervals of 2 dB is achieved.

EXAMPLE

An attenuator device as shown in FIG. 4 was constructed with relative attenuations $A_1$ through $A_5$ as follows: 0.5, 8, 2, 4 and 1 dB, respectively. The 4 and 8 dB attenuator elements were formed as shown in FIGS. 2-3 and the remaining three attenuator elements were formed as shown in FIG. 1, with all of the transistors being formed as passive FETs.

The attenuator device was formed on two chips with total dimensions of 1.3 mm×2.6 mm using a GaAs substrate having a thickness of 0.3 mm. In laying out the two chips, physical symmetry was maintained between reference and attenuation paths as much as possible. The 8 and 0.5 dB attenuator elements were formed on one chip and the 4, 2 and 1 dB attenuator elements on the other chip. Air bridge crossovers enabled all the ground and control connections to be brought to the edges of each chip. The chips had a total of 34 FETs, 36 resistors and 12 inductors. The design characteristics of the transistors (channel width in $\mu m$). resistors (resistance ohm) and transmission lines (width×length in $\mu m$) are given in Tables 1 and 2 (below). using the reference letters from FIGS. 1-3.

In Tables 1 and 2, the values of $T_1-T_{10}$ are in $\mu m$, $R_1-R_8$ are in ohms, and $L_3-L_8$ are in $\mu m \times \mu m$.

TABLE 1

|  | 0.5 dB | 1 dB | 2 dB |
|---|---|---|---|
| $T_1 = T_2$ | 600 | 600 | 600 |
| $T_3 = T_6$ | 30 | 30 | 30 |
| $T_4 = T_5$ | 400 | 300 | 200 |
| $R_1$ | 415 | 415 | 415 |
| $R_2 = R_4$ | 2500 | 2500 | 2500 |
| $R_3$ | 265 | 172 | 120 |
| $L_1 = L_2$ | 100 × 25 | 100 × 38 | 100 × 68 |

TABLE 2

|  | 4 dB | 8 dB |
|---|---|---|
| $T_7 = T_9$ | 260 | 260 |
| $T_8 = T_{10}$ | 220 | 220 |
| $R_5 = R_6$ | 2500 | 2500 |
| $R_7 = R_8$ | 2500 | 2500 |
| $L_4 = L_6$ | 15 × 300 | 15 × 300 |
| $L_5 = L_7$ | 15 × 200 | 15 × 200 |
| $L_8$ | 15 × 265 | 15 × 265 |

To determine the design parameters listed in Tables 1 and 2, the particular attenuation step ($\alpha$) is selected. e.g. in the first column of Table 1, $\alpha = 0.5$ dB. In addition, a characteristic impedance ($Z_o$) for the attenuator element is selected. For example, a common standard characteristic impedance is 50 ohms, which was used to obtain the values in Tables 1 and 2. Given the desired loss and the characteristic impedance, the resistances of the elements in series, which resistances are the same, and the resistance of the shunt resistor can each be determined. When FETs are used, their channel widths (w) can be determined because channel width is inversely proportional to resistance. Where transmission lines are used, their physical widths can be determined using the characteristic impedance, as width is proportional to impedance, and their physical lengths can be determined as length and width are proportional to inductance. Calculation of specific design values is believed to be well within the capability of one of ordinary skill in the art.

The circuits were fabricated by sheet implantation of silicon ions into undoped GaAs wafers. Two different implant energies and doses were used to achieve the desired sheet resistivity and carrier profile. Active areas for resistors and FETs were isolated with a wet-chemical mesa-etch process. Ohmic contact to these active areas was provided by a five-layer metal composite (Au/Ge/Ni/Ag/Au) that was deposited by electron-beam evaporation, patterned by liftoff techniques, and subsequently alloyed.

The gate patterns for the FETs in the circuit were opened in a positive electron-beam resist (polymethyl-methacrylate) by means of direct-write, electron-beam lithography. The gate channel was recessed with a wet-chemical etchant using the gate-patterned resist as an etch mask. The gate metal, a Ti/Pt/Au composite, was deposited through the same openings in the resist, so that the gates and channels were self-aligned after liftoff. The resistors and FET channel areas were protected with a layer of silicon nitride, deposited by enhanced plasma-chemical vapor deposition, that was patterned by reactive ion etching. Gold air bridges were used to interconnect FET source fingers, and for transmission line crossovers. Air bridges, transmission lines, and other passive circuit metal areas were produced by a plate-up, pulse-plating process. After front-side processing was completed, the wafers were lapped to the design thickness, and the ground plane was fabricated by vapor deposition and electroplating.

Figure 5:
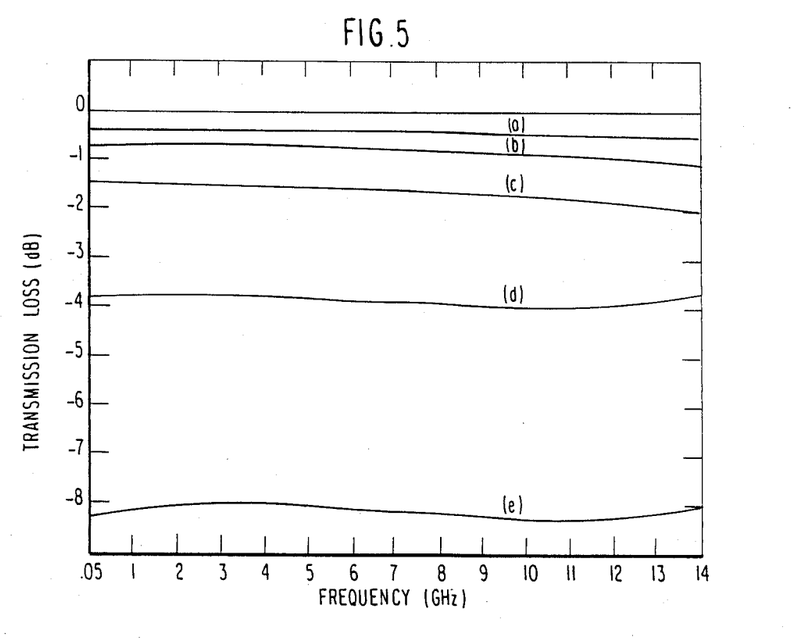
FIG. 5 is a plot of transmission loss for each attenuator element in the device of FIG. 4 as a function of signal frequency.
Figure 6:
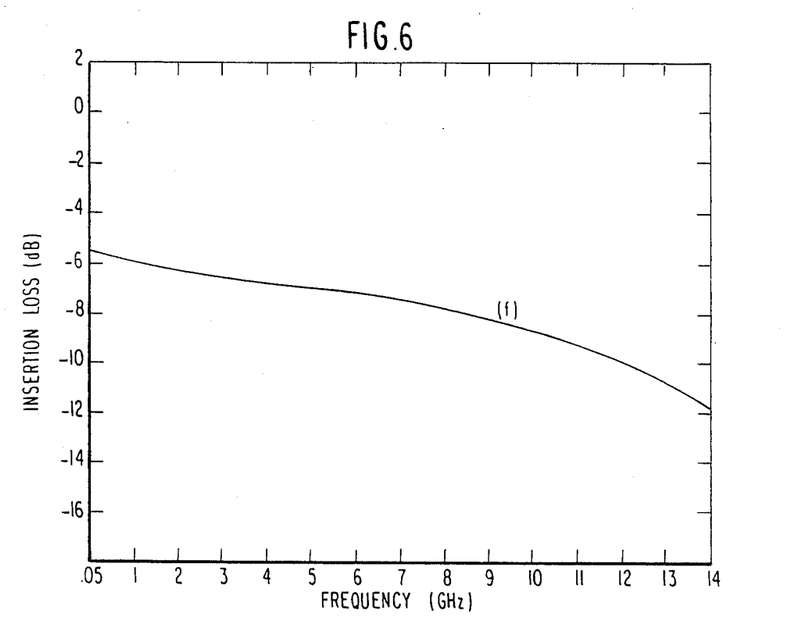
FIG. 6 is a plot of total insertion loss for the entire device of FIG. 4 as a function of signal frequency.

The performance of the attenuator device was measured using control signals of zero volts (conductive) and negative 4 volts (pinched-off), and FIGS. 5-8 show the results. Transmission loss across each attenuator element in the attenuator device was measured for input signals having frequency levels from 50 MHz to 14 GHz, and the results are shown in FIG. 5 in which curves (a) through (e) respectively correspond to the attenuation elements 0.5, 1, 2, 4 and 8 dB. As can be seen from FIG. 5, the transmission loss for each element is fairly constant over a broad range of frequencies. Absolute insertion loss for the whole attenuator device is shown by curve (F) in FIG. 6. At 50 MHz insertion loss is 5.6 dB, and at 12 GHz insertion loss is 10 dB.

Figure 7:
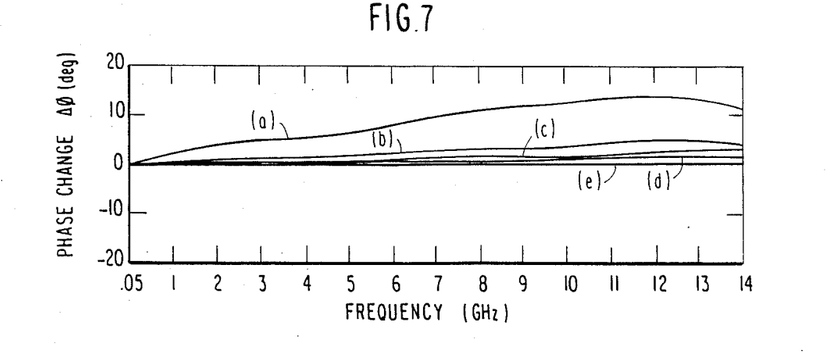
FIG. 7 is a plot of phase change of an input signal caused by each attenuator element in the attenuator device of FIG. 4 as a function of signal frequency
Figure 8:
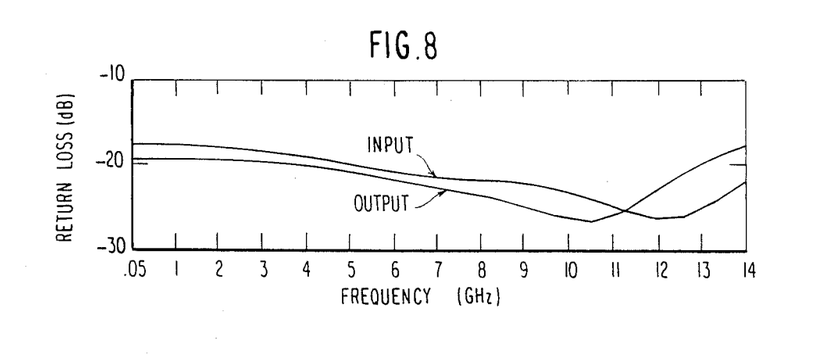
FIG. 8 is a plot of return loss for the entire attenuation device of FIG. 4.

Phase change of an input signal was also measured. FIG. 7 shows the measured phase change for each of the attenuator elements for signal frequencies from 50 MHz to 14 GHz. Curves (a) through (e) respectively correspond to the 0.5, 1, 2, 4 and 8 dB elements. FIG. 8 shows INPUT and OUTPUT signals to the entire attenuator device, and hence the measured return loss for the entire attenuator device. As shown in FIG. 7, the maximum transmission phase change is 14° occurring in the 8 dB element. The return loss is better than 18 dB over the 50 MHz to 14 GHz frequency range.

Figure 9:
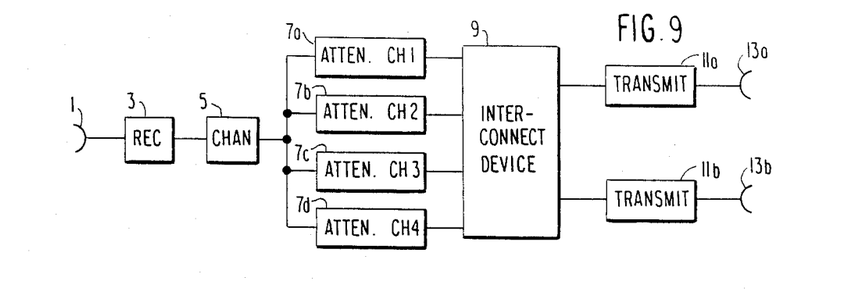
FIG. 9 is a block diagram of transponder circuitry including an attenuator according to the invention.

FIG. 9 shows application of the attenuator device of the present invention in a transponder, e.g. on-board a communications satellite, for purposes of compensating for losses and gains of a receiver amplifier and/or transmitter amplifier in the transponder. In such a satellite, as previously noted, a signal such as a frequency modulated multiplex signal is sent from the earth to a receiving antenna 1 on the satellite. The received transmission is sent from the antenna 1 through a receiver (REC) 3 in which the signal is amplified. The receiver 3 may also change the frequency of the signal from that used to transmit the signal to the satellite to that desired for transmission from the satellite to a designated area or areas on the earth. The amplified signal then passes through a channelizer (CHAN) 5 (e.g. various band pass filters) to channelize the signal. For purposes of illustration, four channels (CH1, CH2, CH3 and CH4) are shown in FIG. 9. Each channelized signal passes through a respective attenuator (ATTEN) device (or element) 7a, 7b, 7c and 7d according to the invention. Then, each attenuated signal enters an interconnect device 9 (e.g. various switches) to combine with other signals intended for transmission from a transmit antenna 13(a) to an area on the earth or signals intended for transmission from another transmit antenna 13(b) to another area on the earth. Prior to transmission, each combined signal passes through a transmit tube 11a or 11b which amplifies the signal. The attenuator devices 7a, 7b, 7c and 7d are controlled so as to keep the signal gain resulting from the receiver and transmit tube amplification relatively constant throughout the life of the satellite. The placement and number of attenuator devices can be varied extensively. For example, an additional attenuator can be placed in the circuitry of the receiver 3, as long as the devices are controlled so as to maintain a relatively constant gain. Further, if the signal sent to the satellite does not have multiple channels the channelizer can be omitted and the transponder circuitry modified accordingly. It should be noted that the transmit antennas 13a and 13b could be formed as one antenna.

Figure 10:
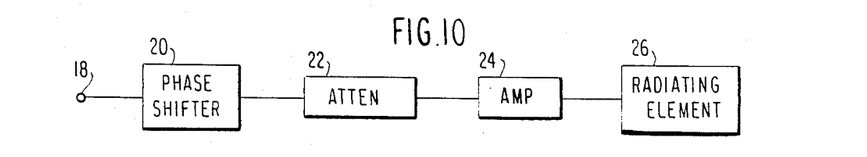
FIG. 10 is a block diagram of beam shaping circuitry for a phased array antenna, which circuitry includes an attenuator according to the invention

Another application of the inventive attenuator is in phased array devices. FIG. 10 shows beam shaping circuitry, including the attenuator device of the present invention, for a phased array antenna. A beam sent by a phased array antenna includes numerous beam elements, each individually controlled to achieve a total beam. To properly shape and direct each beam element of the total beam, the phase and amplitude of the signal must be controlled for that particular beam element. FIG. 10 shows the beam shaping circuitry for one beam element of numerous beam elements in the phased array antenna. The circuitry for forming each of the other beam elements is the same as that shown in FIG. 10. Accordingly, a particular signal to be sent by the phased array antenna is distributed by a microprocessor or the like to the beam shaping circuitry of each radiating element in the phased array antenna. The signal is received at input terminal 18 and processed by a phase shifting element 20 to obtain a desired phase. An attenuator 22 and amplifier 24 then give the signal a desired magnitude for the particular radiating element 26. Precise phase and amplitude control is necessary to avoid creation of undesirable side lobes. Accordingly, it is desirable that any phase changes to the beam element signal in the attenuator 22 be minimized, so that the precise desired phase and amplitude can quickly and easily be obtained. Relatively large changes in phase due to changes in magnitude will necessitate numerous iterations of phase shifting and attenuation to achieve the desired phase and magnitude.

A related application for the attenuator device according to the invention is in a phased array radar system. In general, a phased array radar has the same shaping circuitry as that of the phased array antenna, except that the attenuator device for each particular radiating element may or may not be individually controllable. That is, the amount of attenuation for any given radiating element may be set at predetermined, non-variable amounts, or control signals may be used.

The attenuator of the present invention can be formed in several equivalent ways which will be apparent to one of ordinary skill in the art, without departing from the spirit of the invention and the scope of the appended claims. For example, instead of forming the attenuator device of the invention with three or five elements, any number of elements suitable for the intended application can be used. Further, instead of using transmission lines as the inductive elements, other elements may be used to equalize the phases of the reference and attenuation paths of each attenuator element. If phase differences are unimportant, no transmission lines need be used.

In addition, although a T-network is preferred for the reference and attenuation paths of the attenuator element of FIG. 1, and for the resistive network of the attenuator element of FIGS. 2-3 another type of network such as a pi-network could be used. Such attenuator elements are shown in FIGS. 11 and 12.

Figure 11:
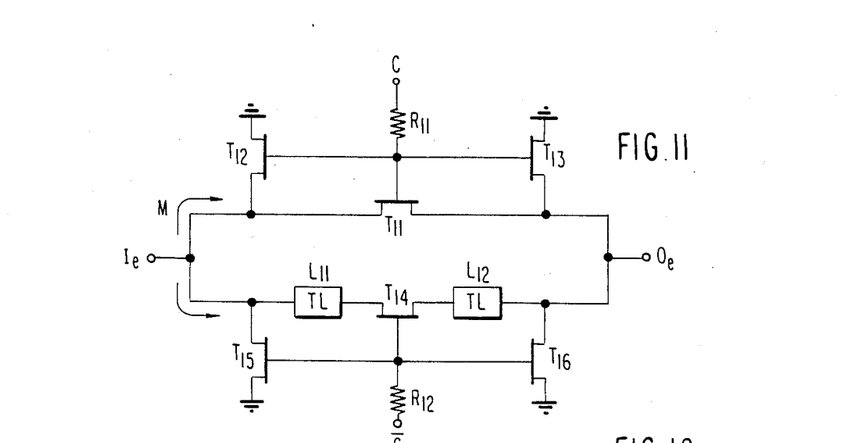
FIG. 11 is a third type of attenuator element according to the invention.

In FIG. 11, as in FIG. 1, there is a reference path M and an attenuation path N. Both paths have a Pi-network formed with three FETs, $T_{11}$ and shunt transistors $T_{12}$ and $T_{13}$ to ground (reference path): and $T_{14}$ and shunt transistors $T_{15}$ and $T_{16}$ to ground (attenuation path). The gates of the FETs $T_{11}$, $T_{12}$ and $T_{13}$ are connected to a control signal (through a resistor $R_{11}$ and the gates of the FETs $T_{11}$, $T_{12}$ and $T_{13}$ are connected to a complementary control signal $\overline{C}$ through a resistor $R_{12}$. To equalize relative phase change of the two paths M and N, transmission lines $L_{11}$ and $L_{12}$ are placed on opposite sides of the FET $T_{14}$ on the attenuation path.

Figure 12:
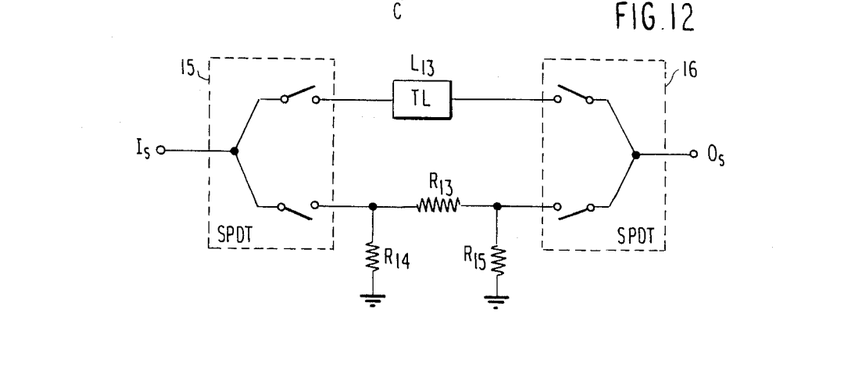
FIG. 12 is a fourth type of attenuator element according to the invention.

In FIG. 12, similar to FIG. 2 there is a reference path formed by a transmission line $L_{13}$ and an attenuation path, and there are two SPDT switches 15, 16 (constructed as in FIG. 3) for switching between the two paths. However, the attenuation path is formed by a Pi-network of resistor $R_{13}$ and two shunt resistors $R_{14}$ and $R_{15}$ to ground.

In FIG. 12, $I_s$ indicates an input terminal and $O_s$ an output terminal.

It should be noted that although each of the attenuator elements according to the invention are formed using symmetrical networks of circuit devices (such as T and Pi-networks), in some applications (e.g. for satisfying fabrication constraints) it may be useful to form an attenuator device in which individual elements have an impedance transformation.

The attenuator according to the present invention has numerous advantages, many of which are set forth below. It is a very light, compact device. The attenuator is a digital device requiring generation of only a single bit signal to determine the control signal and its complement for each attenuator element. The circuitry is thus simplified by the minimal number of control bits. Moreover, due to the digital control no digital to analog converter is necessary to operate the attenuator. Thus, the device is simpler, more reliable and more temperature stable than attenuator devices which require digital to analog converters. Power consumption is also minimized by the elimination of digital to analog converters. Return loss is minimized, and thus no diodes or other circuit isolation devices need be used in the attenuator according to the invention. Further, phase is easily equalized by symmetry in the reference and attenuation paths. The attenuator increases reliability and decreases power consumption by using passive device such as passive FETs and thus is especially useful in applications on-board satellites. The attenuator has a very broad bandwidth, e.g. from 50 MHz to 14 GHz, or at least to 12 GHz, with minimal changes in phase in spite of attenuation, because no external capacitive elements are used in the device. The broad bandwidth and minimal phase changes are especially important in phased array applications, as well as transponder applications. The attenuator can achieve a zero to 15.5 dB range with increments of 0.5 dB using only five attenuator elements and thus five control bits. Similarly, a zero to 14 dB range with 2 dB steps can be achieved with only three attenuator elements and three control bits.

The attenuator can be formed on a GaAs substrate, which has approximately six times greater mobility of electrons than an Si substrate, and can be formed as a solid-state, monolithic device reproducible using a mask work. The attenuator can thus be easily mass produced, making it especially useful for phased array and other applications where numerous attenuators are employed. The attenuator is configured so as to require minimal external matching of attenuator elements thus resulting in minimum size. Circuit performance is insensitive to many fabrication variations.

What is claimed is:

1. An attenuator comprising:
    a first path for carrying an electrical signal from an input terminal to an output terminal of the attenuator, said first path including cascaded first and second electrical devices, a third electrical device being connected to a point on said first path between said first and second devices, said first, second and third devices being connected together at control electrodes and receiving at said control electrode one of a first control input for enabling signal transmission and a second control input for disabling signal transmission;
    a second path for carrying an electrical signal from an input terminal to an output terminal of the attenuator, said second path including cascaded fourth and fifth electrical devices, as sixth electrical device being connected to a point on said second path between said fourth and fifth devices, said fourth, fifth and sixth devices being connected together at control electrodes and receiving at the control electrodes the other of the first and second control inputs; and
    control means for selectively applying one of the first and second control inputs to the control electrodes of said first, second and third electrical devices and the other of the first and second control inputs to the control electrodes of said fourth, fifth and sixth electrical devices,
wherein a resistance disposed along said first path is different from a resistance disposed along said second path.

2. The attenuator of claim 1, wherein said first and second electrical devices are transistors having a first, channel width, and said fourth and fifth electrical devices are transistors having a second channel width differing from said first channel width.

3. The attenuator of claim 2 further comprising means for equalizing a stray inductance of said first and second paths.

4. An attenuator comprising:
    a reference path for carrying an electrical signal from an input terminal to an output terminal of the attenuator, said reference path including a first pair of transistors therein for carrying the electrical signal while operating in a passive mode when enabled, the transistors of said first pair of transistors being connected in series with one another with a source of one of said transistors of said first pair of transistors being connected to a drain of the other transistor of said first pair of transistors;
    an attenuation path for carrying the electrical signal from the input terminal to the output terminal and providing a predetermined relative attenuation of the electrical signal, said attenuation path including a second pair of transistors for carrying the electrical signal while operating a passive mode when enabled, said second pair of transistors being connected in series with one another with a source of one transistor of said second pair of transistors being connected to a drain of the other transistor of said second pair of transistors;
    a first shunt transistor connected from ground to said reference path between said transistors of said first pair of transistors;
    a second shunt transistor connected from ground to said attenuation path between said transistors of said second pair of transistors; and
    control means for selectively enabling one transistor of said first pair of transistors in said reference path and one transistor of said second pair of transistors in said attenuation path for signal transmission while leaving the other transistor of said first and second pairs of transistors disabled.

5. The attenuator of claim 4, wherein each of the transistors is a field effect transistor functioning as a variable resistor.

6. An attenuator comprising:
    a reference path for carrying an electrical signal from an input terminal to an output terminal of the attenuator, said reference path including at least one transistor therein for carrying the electrical signal while operating in a passive mode when enabled, and two shunt transistors connected between ground and said reference path with said at least one transistor in said reference path connected therebetween;
    an attenuation path for carrying the electrical signal from the input terminal to the output terminal and providing a predetermined relative attenuation of the electrical signal, said attenuation path including at least one transistor therein for carrying the electrical signal while operating in a passive mode when enabled, and two shunt transistors connected between ground and said attenuation path with said at least one transistor of said attenuation path connected therebetween; and
    control means for selectively enabling one of the at least one transistor in said reference path and the at least one transistor in said attenuation path for signal transmission while leaving the other one of the at least one transistors in said reference and attenuation paths disabled.

7. The attenuator of claim 6, wherein each of the transistors is a field effect transistor functioning as a variable resistor.

8. An attenuator comprising:
    a reference path for carrying an electrical signal from an input terminal to an output terminal of the attenuator, said reference path including at least one transistor therein for carrying the electrical signal while operating in a passive mode when enabled;
    an attenuation path for carrying the electrical signal from the input terminal to the output terminal and providing a predetermined relative attenuation of the electrical signal, said attenuation path including at least one transistor therein for carrying the electrical signal while operating in a passive mode when enabled, said at least one transistor in said attenuation path having a gate width which is different from a gate width of the at least one transistor in said reference path; and
    control means for selectively enabling one of the at least one transistor in said reference path and the at least one transistor in said attenuation path for signal transmission while leaving the other one of the at least one transistor in said reference and attenuation paths disabled.

9. The attenuator of claim 8, further comprising means disposed along said attenuation path for equalizing a relative phase change of the electrical signal carried from the input terminal to the output terminal along one of said attenuation path and along said reference path.

10. An attenuator comprising:

a reference path having first and second electrical devices disposed therein for carrying an electrical signal from an input terminal to an output terminal of the attenuator when enabled, each of said first and second electrical devices having a control electrode;

an attenuation path having third and fourth electrical devices disposed therein for carrying the electrical signal from the input terminal to the output terminal and providing a predetermined relative attenuation of the electrical signal when enabled, each of said third and fourth electrical devices having a control electrode; and control means for selecting one of said reference path and said attenuation path for signal transmission and disabling the other of said reference path and said attenuation path, said control means applying one of a zero voltage control input for enabling signal transmission and a pinch-off voltage control input for disabling signal transmission to the control electrodes of said first and second electrical devices, and simultaneously applying the other of said zero voltage and pinch-off voltage control inputs to the control electrodes of said third and fourth electrical devices.

11. An attenuator device comprising at least first and second cascaded attenuator elements, wherein the first attenuator element comprises:

a reference path for carrying an electrical signal from an input terminal to an output terminal of the attenuator element, said reference path including at least one transistor for carrying the electrical signal while operating in a passive mode when enabled, an attenuation path for carrying the electrical signal from the input terminal to the output terminal and providing a predetermined relative attenuation of the electrical signal, said attenuation path including at least one transistor for carrying the electrical signal while operating in a passive mode when enabled, and control means for selectively enabling one of the at least one transistor in said reference path and the at least one transistor in said attenuation path for signal transmission while leaving the other one of the at least one transistor in said reference and attenuation paths disabled; and wherein said second attenuator element comprises:

a reference path having a first electrical device disposed therein for carrying an electrical signal from an input terminal thereof to an output of the attenuator element when enabled, a second electrical device connected between ground and a point on said reference path on one side of said first electrical device, and a third electrical device connected between ground and a point on said reference path on the other side of said first electrical device so as to form a Pi-network, an attenuator path having a fourth electrical device disposed therein for carrying the electrical signal from the input terminal thereof to the output terminal thereof and providing a predetermined relative attenuation of the electrical signal when enabled, a fifth electrical device connected between ground and a point on said attenuation path on one side of said fourth electrical device, and a sixth electrical device connected between ground and a point on said attenuation path on the other side of said fourth electrical device so as to form a Pi-network, and control means for selecting one of said reference path and said attenuation path for signal transmission and disabling the other of said reference path and said attenuation path.

12. An attenuator comprising:

a reference path for carrying an electrical signal from an input terminal to an output terminal of the attenuator, said reference path including at least one transistor for carrying the electrical signal when enabled:

an attenuation path for carrying the electrical signal from the input terminal to the output terminal and providing a predetermined relative attenuation of the electrical signal, said attenuation path including at least one transistor for carrying the electrical signal when enabled; and control means for selectively enabling one of the at least one transistor in said reference path and the at least one transistor in said attenuation path for signal transmission while leaving the other one of the at least one transistor disabled, wherein the at least one transistor in said reference path has a first channel width, and the at least one transistor in said attenuation path has a second channel width differing from said first channel width by an amount corresponding to the predetermined relative attenuation.

13. The attenuator of claim 12, further comprising means for equalizing an inductance disposed in said reference path and an inductance disposed in said attenuation path.

14. An attenuator comprising:

a reference path having first and second electrical devices disposed therein for carrying an electrical signal from an input terminal to an output terminal of the attenuator when enabled, and a third electrical device connected between ground and a point on said reference path between said first and second electrical devices so as to form a first T-network;

an attenuation path having fourth and fifth electrical devices disposed therein for carrying the electrical signal from the input terminal to the output terminal and providing a predetermined, relative attenuation of the electrical signal when enabled, and a sixth electrical device connected between ground and a point on said attenuation path between said fourth and fifth electrical devices so as form a second T-network; and control means for selecting one of said reference path and said attenuation path for signal transmission and disabling the other of said reference path and said attenuation path.

15. The attenuator of claim 14, wherein each of said electrical devices has a control electrode, said control means applies one of a first control input for enabling signal transmission and a second control input for disabling signal transmission to the control electrodes of said first, second and fifth electrical devices, and said control means simultaneously applies the other of said first and second control inputs to the control electrodes of said third, fourth and sixth electrical devices.

16. The attenuator of claim 15, wherein the first control input is zero voltage and the second control input is a pinch-off voltage.

17. An attenuator comprising:
a reference path having first and second electrical devices disposed therein for carrying an electrical signal from an input terminal to an output terminal of the attenuator when enabled, said first and second electrical devices comprising field effect transistors functioning as variable resistors;
an attenuation path having third and fourth electrical devices disposed therein for carrying the electrical signal from the input terminal to the output terminal and providing a predetermined relative attenuation of the electrical signal when enabled, said third and fourth electrical devices comprising a field effect transistors functioning as variable resistors;
control means for selecting one of said reference path and said attenuation path for signal transmission and disabling the other of said reference path and said attenuation path.

18. The attenuator of claim 17, wherein said first and second transistors have a channel width which is different from a channel width of said third and fourth transistors.

19. An attenuator comprising:
a reference path having a first electrical device disposed therein for carrying an electrical signal from an input terminal to an output terminal of the attenuator when enabled;
a second electrical device connected between ground and a point on said reference path on one side of said first electrical device, and a third electrical device connected between ground and a point on said reference path on the other side of said first electrical device so as to form a Pi-network:
an attenuation path having a fourth electrical device disposed thereon for carrying the electrical signal from the input terminal to the output terminal and providing a predetermined relative attenuation of the electrical signal when enabled:
a fifth electrical device connected between ground and a point on said attenuation path on one side of said fourth electrical device, and a sixth electrical device connected between ground and a point on said attenuation path on the other side of said fourth electrical device so as to form a Pi-network and
control means for selecting one of said reference path and said attenuation path for signal transmission and disabling the other of said reference path and said attenuation path.

20. The attenuator of claim 19, wherein each of said electrical devices has a control electrode, said control means applies one of a first control input for enabling signal transmission and a second control input for disabling signal transmission to the control electrodes of said first, second and third electrical devices and said control means simultaneously applies the other of said first and second control inputs to the control electrodes of said fourth, fifth and sixth electrical devices.

21. The attenuator of claim 20, wherein the first control input is zero voltage and the second control input is a pinch off voltage.

22. The attenuator of claim 19, wherein said first, second, third, fourth, fifth and sixth electrical devices are field effect transistors functioning as variable resistors.

23. The attenuator of claim 22, wherein said first transistor has a channel width which is different from a channel width of said fourth transistor.

24. An attenuator comprising:
a first path for carrying an electrical signal from an input terminal to an output terminal of the attenuator, said first path including a first electrical device therein;
a second path for carrying an electrical signal from said input terminal to said output terminal of the attenuator, said second path including a second electrical device therein;
a third electrical device being connected to a point on said first path between said first electrical device and said input terminal, a fourth electrical device being connected to a point on said first path between said first electrical device and said output terminal, said first, third and fourth electrical devices having control electrodes being connected together for receiving at said control electrodes one of a first control input for enabling signal transmission and a second control input for disabling signal transmission;
a fifth electrical device being connected to a point on said second path between said second electrical device and said input terminal, a sixth electrical device being connected to a point on said second path between said second electrical device and said output terminal, said second, fifth and sixth electrical devices having control electrodes being connected together for receiving at said control electrodes the other of the first and second control inputs; and
control means for selectively applying one of the first and second control inputs to the control electrodes of said first, third and fourth electrical devices and the other of the first and second control inputs to the control electrodes of said second, fifth and sixth electrical devices,
wherein a resistance disposed along said first path is different from a resistance disposed along said second path.

25. The attenuator of claim 24, wherein said first and second electrical devices are transistors having a first channel width, and said fourth and fifth electrical devices are transistors having a second channel width differing from said first channel width.

26. The attenuator of claim 25, further comprising means for equalizing a stray inductance of said first and second paths.

27. An attenuator device comprising at least first and second cascaded attenuator elements,
wherein the first attenuator element comprises:
a reference path for carrying an electrical signal from an input terminal to an output terminal of the attenuator element, said reference path including at least one transistor for carrying the electrical signal while operating in a passive mode when enabled,
an attenuation path for carrying the electrical signal from the input terminal to the output terminal and providing a predetermined relative attenuation of the electrical signal, said attenuation path including at least one transistor for carrying the electrical signal while operating in a passive mode when enabled, and
control means for selectively enabling one of the at least one transistor in said reference path and the at least one transistor in said attenuation path for signal transmission while leaving the other one of the at least one transistor in said reference and attenuation paths disabled, wherein the second attenuator element comprises:
a first path for carrying an electrical signal from an input terminal thereof to an output terminal of the attenuator element, said first path including cascaded first and second electrical devices, a third electrical device being connected to a point on said first path between said first and second devices, said first, second and third devices having control electrodes connected together for receiving at said control electrodes one of a first control input for enabling signal transmission and a second control input for disabling signal transmission, a second path for carrying an electrical signal from an input terminal thereof to an output terminal of the attenuator element, said second path including cascaded fourth and fifth electrical devices, a sixth electrical device being connected to a point on said second path between said fourth and fifth devices, said fourth, fifth and sixth devices having control electrodes connected together for receiving at said control electrodes the other of the first and second control inputs, and control means for selectively applying one of the first and second control inputs to the control electrodes of said first, second and third electrical devices and the other of said first and second control inputs to the control electrodes of said fourth, fifth and sixth electrical devices, wherein a resistance disposed along said first path is different from a resistance disposed along said second path.

28. An attenuator device comprising at least first and second cascaded attenuator elements, wherein the first attenuator element comprises:
a reference path for carrying an electrical signal from an input terminal to an output terminal of the attenuator element, said reference path including at least one transistor for carrying the electrical signal while operating in a passive mode when enabled, an attenuation path for carrying the electrical signal from the input terminal to the output terminal and providing a predetermined relative attenuation of the electrical signal, said attenuation path including at least one transistor for carrying the electrical signal while operating in a passive mode when enabled, and control means for selectively enabling one of the at least one transistor in said reference path and the at least one transistor in said attenuation path for signal transmission while leaving the other one of the at least transistor in said reference and attenuation paths disabled, wherein the second attenuator element comprises:
a first path for carrying an electrical signal from an input terminal thereof to an output terminal of the attenuator element, said first path including a first electrical device, a second path for carrying an electrical signal from an input terminal thereof to an output terminal of the attenuator element, said second path including a second electrical device, a third electrical device being connected to a point on said first path between said first electrical device and said input terminal, a fourth electrical device being connected to a point on said first path between said first electrical device and said output terminal, said first, third and fourth electrical devices having control electrodes connected together for receiving at said control electrodes one of a first control input for enabling signal transmission and a second control input for disabling signal transmission, a fifth electrical device connected to a point on said second path between said second electrical device and said input terminal, a sixth electrical device connected to a point on said second path between said second electrical device and said output terminal, said second, fifth and sixth electrical devices having control electrodes connected together for receiving at said control electrodes the other of said first and second control inputs, and control means for selectively applying one of the first and second control inputs to the control electrodes of said first, third and fourth electrical devices and the other of the first and second control inputs to the control electrodes of said second, fifth and sixth devices, and wherein a resistance disposed along said first path is different from a resistance disposed along said second path.

29. An attenuator device comprising at least first and second cascaded attenuator elements, wherein the first attenuator element comprises:
a reference path for carrying an electrical signal from an input terminal to an output terminal of the attenuator element, said reference path including at least one transistor for carrying the electrical signal while operating in a passive mode when enabled, an attenuation path for carrying the electrical signal from the input terminal to the output terminal and providing a predetermined relative attenuation of the electrical signal, said attenuation path including at least one transistor for carrying the electrical signal while operating in a passive mode when enabled, and control means for selectively enabling one of the at least one transistor in said reference path and the at least one transistor in said attenuation path for signal transmission while leaving the other one of the at least transistor disabled, wherein the second attenuator element comprises:
a reference path for carrying an electrical signal from an input terminal thereof to an output terminal of the attenuator element, said reference path including at least one transistor for carrying the electrical signal when enabled, an attenuation path for carrying the electrical signal from the input terminal thereof to the output terminal thereof and providing a predetermined relative attenuation of the electrical signals, said attenuation path including at least one transistor for carrying the electrical signal when enabled, and control means for selectively enabling one of the at least one transistor in said reference path and the at least one transistor in said attenuation path for signal transmission while leaving the other one of the at least one transistor in said reference and attenuation paths disabled.

wherein the at least one transistor in said reference path has a first channel width and the at least one transistor in said attenuation path has a channel width differing from the first channel width by an amount corresponding to the predetermined relative attenuation.

* * * * *

UNITED STATES PATENT AND TRADEMARK OFFICE
CERTIFICATE OF CORRECTION

PATENT NO. : 4,978,932

DATED : DECEMBER 18, 1990

INVENTOR(S) : GUPTA et al

It is certified that error appears in the above-identified patent and that said Letters Patent is hereby corrected as shown below:

Col. 4, line 13, delete "." insert --,--;
       line 28, delete " HoweVer" insert -- However--;
       line 42, delete "." insert --,--.

Signed and Sealed this

Eighth Day of December, 1992

Attest:

DOUGLAS B. COMER

*Attesting Officer*     *Acting Commissioner of Patents and Trademarks*